United States Patent
Glass et al.

(10) Patent No.: US 7,091,788 B2
(45) Date of Patent: Aug. 15, 2006

(54) BIASED DARLINGTON TRANSISTOR PAIR, METHOD, AND SYSTEM

(75) Inventors: Kevin W. Glass, Scottsdale, AZ (US); Malcolm H. Smith, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/727,262

(22) Filed: Dec. 3, 2003

(65) Prior Publication Data
US 2005/0122172 A1 Jun. 9, 2005

(51) Int. Cl.
*H03F 3/04* (2006.01)

(52) U.S. Cl. .................. 330/296; 330/285; 330/311

(58) Field of Classification Search ........... 330/296, 330/285, 311
See application file for complete search history.

(56) References Cited

U.S. PATENT DOCUMENTS

| | | | | |
|---|---|---|---|---|
| 4,706,038 A | * | 11/1987 | Navidi et al. | 330/311 |
| 4,855,625 A | * | 8/1989 | Webb | 330/257 |
| 5,264,806 A | * | 11/1993 | Kobayashi | 330/294 |
| 5,548,288 A | * | 8/1996 | Lueng | 327/433 |
| 5,724,004 A | * | 3/1998 | Reif et al. | 330/296 |
| 5,859,568 A | * | 1/1999 | Le et al. | 330/296 |
| 6,392,492 B1 | * | 5/2002 | Yuan | 330/296 |
| 6,417,734 B1 | * | 7/2002 | Luo et al. | 330/296 |
| 2002/0135423 A1 | | 9/2002 | Yamashita | |
| 2002/0186084 A1 | | 12/2002 | Liwinski | |
| 2003/0146790 A1 | | 8/2003 | Arell et al. | |

OTHER PUBLICATIONS

Boles, Timothy, "A Fully Monolithic HMIC Low Noise Amplifier", *Radio Frequency Integrated Circuits (RFIC) Symposium*, (Jun. 1997), pp. 109-112.

Hodges, David A., "Darlington's Contributions to Transistor Circuit Design", *IEEE Transactions on Circuits and Systems—I: Fundamental Theory and Applications*, vol. 46, No. 1,(Jan. 1999), pp. 102-104.

Trajkovic, Ljiljana , et al., "Replacing a Transistor with a Compound Transistor", *IEEE Transactions on Circuits and Systems*, vol. 35, No. 9,(Sep. 1988), pp. 1139-1146.

Umeda, A.Y., et al., "A Monolithic GaAs HBT Upconverter", *IEEE Microwave and Millimeter-Wave Monolithic Circuits and Symposium*, (May 1990), pp. 77-80.

Copy of International Search Report dated Apr. 4, 2004, PCT/US2004/038730, 8 Pages.

Copy of Written Opinion of the International Searching Authority dated Apr. 4, 2005, PCT/S2004/038730, 5 Pages.

Rodwell, M. , et al., "33 GHz Monolitihic Cascode AlInAs/GaInAs Heterojunctions Bipolar Transistor Feedback Amplifier", *IEEE 1990 Bipolar Circuits and Technology Meeting*, (Sep. 17, 1990),252-255.

* cited by examiner

*Primary Examiner*—Khanh Van Nguyen
(74) *Attorney, Agent, or Firm*—LeMoine Patent Services, PLLC

(57) ABSTRACT

An amplifier includes a Darlington transistor pair and a biasing network to increase bias currents in an input transistor.

22 Claims, 6 Drawing Sheets

Figure 1:
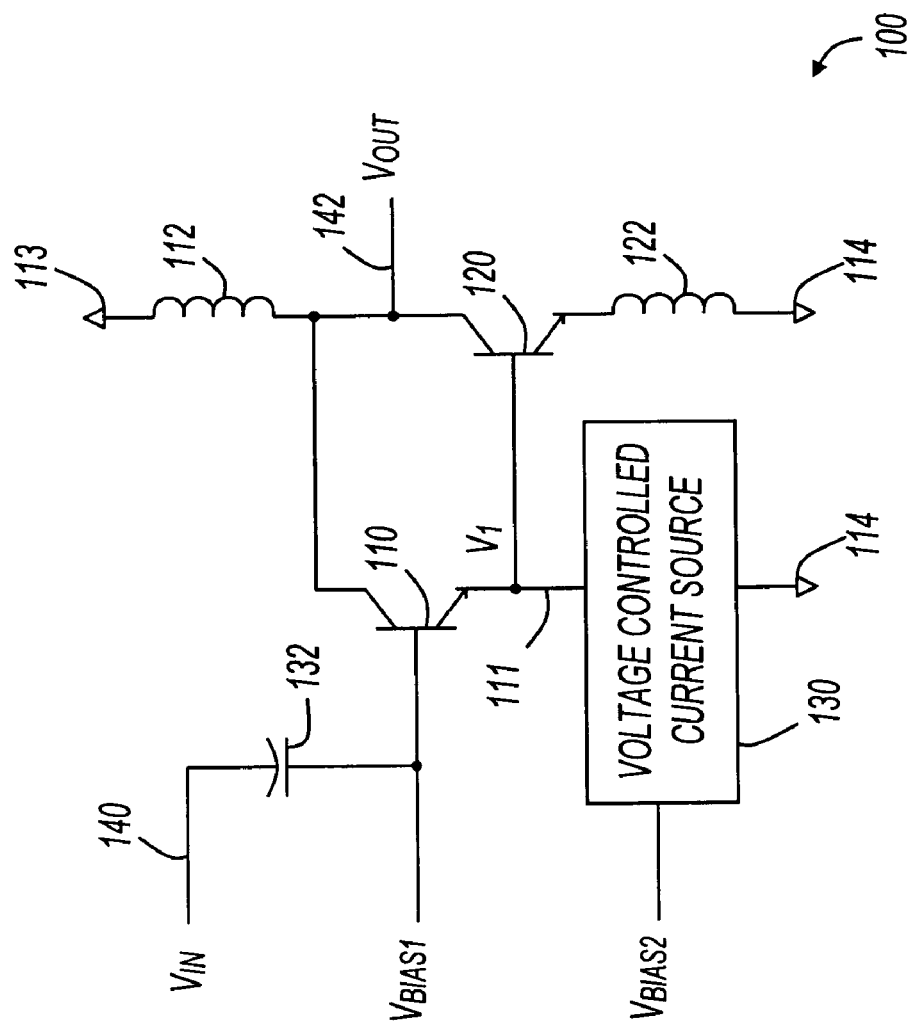

BIASED DARLINGTON TRANSISTOR PAIR, METHOD, AND SYSTEM

FIELD

The present invention relates generally to electronic circuits, and more specifically to Darlington transistor pairs.

BACKGROUND

A "Darlington transistor pair" includes two transistors coupled in a high-gain fashion. The first transistor receives an input signal, amplifies it, and drives the second transistor which amplifies it further.

BRIEF DESCRIPTION OF THE DRAWINGS

FIGS. 1–3 show circuit diagrams including Darlington transistor pairs in accordance with various embodiments of the present invention;

FIGS. 4 and 5 show block diagrams of electronic systems in accordance with various embodiments of the present invention; and FIG. 6 shows a flowchart in accordance with various embodiments of the present invention.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a circuit diagram including a Darlington transistor pair in accordance with various embodiments of the present invention. Circuit 100 includes input transistor 110, second transistor 120, radio frequency (RF) choke 112, degeneration inductor 122, capacitor 132, and voltage controlled current source 130. Input transistor 110 and second transistor 120 are coupled to form a Darlington transistor pair with the collectors coupled together at node 142, and the emitter of input transistor 110 coupled to the base of transistor 120 at node 111.

As shown in FIG. 1, transistors 110 and 120 may be bipolar junction transistors (BJTs). In some embodiments, transistors 110 and 120 are heterojunction bipolar transistors (HBTs), such as those manufactured using an Indium Phosphide (InP) process, although this is not a limitation of the present invention. For example, one or both of transistors 110 and 120 may be an isolated gate transistor (IGFET) such as a metal oxide semiconductor field effect transistor (MOSFET).

Radio frequency choke 112 is coupled between upper power supply node 113 and the collectors of transistors 110 and 120. In some embodiments, RF choke 112 is an inductive collector load providing output impedance matching and a collector bias current without the voltage drop of a resistor. Biasing without a resistant voltage drop allows for high gain and high dynamic range in a particular bandwidth without saturating transistors 110 and 120.

Degeneration inductor 122 is coupled between the emitter of transistor 120 and lower power supply node 114. In some embodiments, inductive emitter degeneration helps to tune input impedance matching and may improve amplifier linearity. Further, in some embodiments, inductive emitter degeneration sets the gain of the amplifier in the bandwidth of interest without adding the thermal noise associated with a resistor, and desensitizes the amplifier to Beta variation.

Capacitor 132 is coupled between signal input node 140 and the base terminal of transistor 110. Capacitor 132 allows alternating current (AC) components of an input signal to pass from node 140 to the base terminal of input transistor 110, and blocks direct current (DC) components of the input signal from passing from node 140 to the base terminal of input transistor 110.

In operation, an input signal (VIN) is received on signal input node 140, and AC components of the signal are transferred to the base terminal of input transistor 110. Input transistor 110 amplifies the input signal and provides it to second transistor 120. Second transistor 120 further amplifies the signal, and provides an amplified output signal (VOUT) on signal output node 142.

The base terminal of input transistor 110 receives a bias voltage (VBIAS1), and the emitter of input transistor 110 receives a bias voltage (V1) on node 111 from voltage controlled current source 130. In some embodiments, V1 is substantially equal to Vbe, where Vbe is the minimum base-to-emitter voltage necessary to bias transistor 120 in the forward active region. Also in some embodiments, VBIAS1 is substantially equal to 2Vbe. In other embodiments, V1 is greater than Vbe, and VBIAS1 is greater than 2Vbe.

Voltage controlled current source 130 is coupled between node 111 and lower power supply node 114. In some embodiments, voltage controlled current source 130 provides the bias voltage V1 in response to a received bias voltage (VBIAS2). In some embodiments, voltage controlled current source 130 operates to keep V1 in a substantially constant relationship to VBIAS2. For example, in some embodiments, voltage controlled current source 130 works to maintain V1 substantially equal to VBIAS2. Voltage controlled current source 130 provides a voltage path to node 111, and also provides a current path from node 111 to lower power supply node 114.

The combination of the bias voltage on the base terminal of transistor 110, the bias voltage on node 111, and the current path from node 111 to lower power supply node 114 allow for an increase in the base-to-emitter and collector-to-emitter bias currents of transistor 110. By increasing the bias currents of input transistor 110, operating characteristics of transistor 110 may be modified. For example, an increase in bias current may increase the gain-bandwidth product and the maximum operating frequency of transistor 110, and may also decrease noise. In some embodiments, the frequency of operation versus noise may also be traded off through adjustment of the various bias currents of input transistor 110.

FIG. 2 shows a diagram of a circuit including a Darlington transistor pair in accordance with various embodiments of the present invention. Circuit 200 includes input transistor 110, second transistor 120, RF choke 112, degeneration inductor 122, capacitor 132, amplifier 210, and low pass filters 220, 230, and 240.

An output node of amplifier 210 is coupled to node 111 through low pass filter 230, and node 111 is fed back to an input of amplifier 210 through low pass filter 240. Amplifier 210 also receives VBIAS2 on an input node. In this configuration, amplifier 210 is coupled as an error amplifier that operates to force V1 to be substantially equal to VBIAS2.

In some embodiments, amplifier 210 is an operational amplifier, and in other embodiments amplifier 210 is implemented with other than an operational amplifier. Amplifier 210 is an example of a voltage controlled current source capable of increasing the various bias currents in input transistor 110. Amplifier 210 provides a voltage path from the output of the amplifier 210 to node 111, and also provides a current path from node 111 to the output of amplifier 210. Amplifier 210 includes an output stage capable of sinking excess bias current coming from the emitter of input transistor 110.

Figure 2:
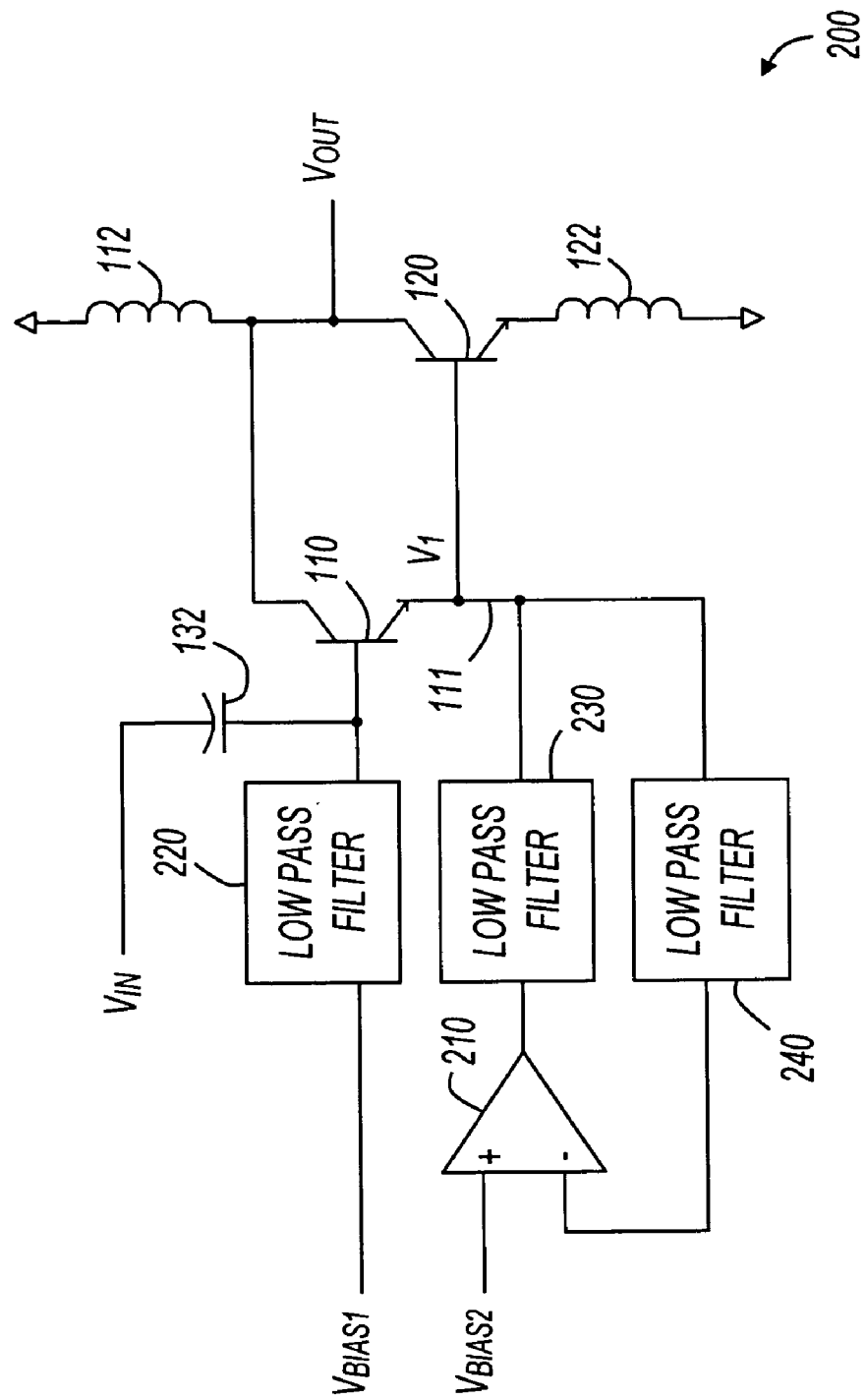
Figure 3:
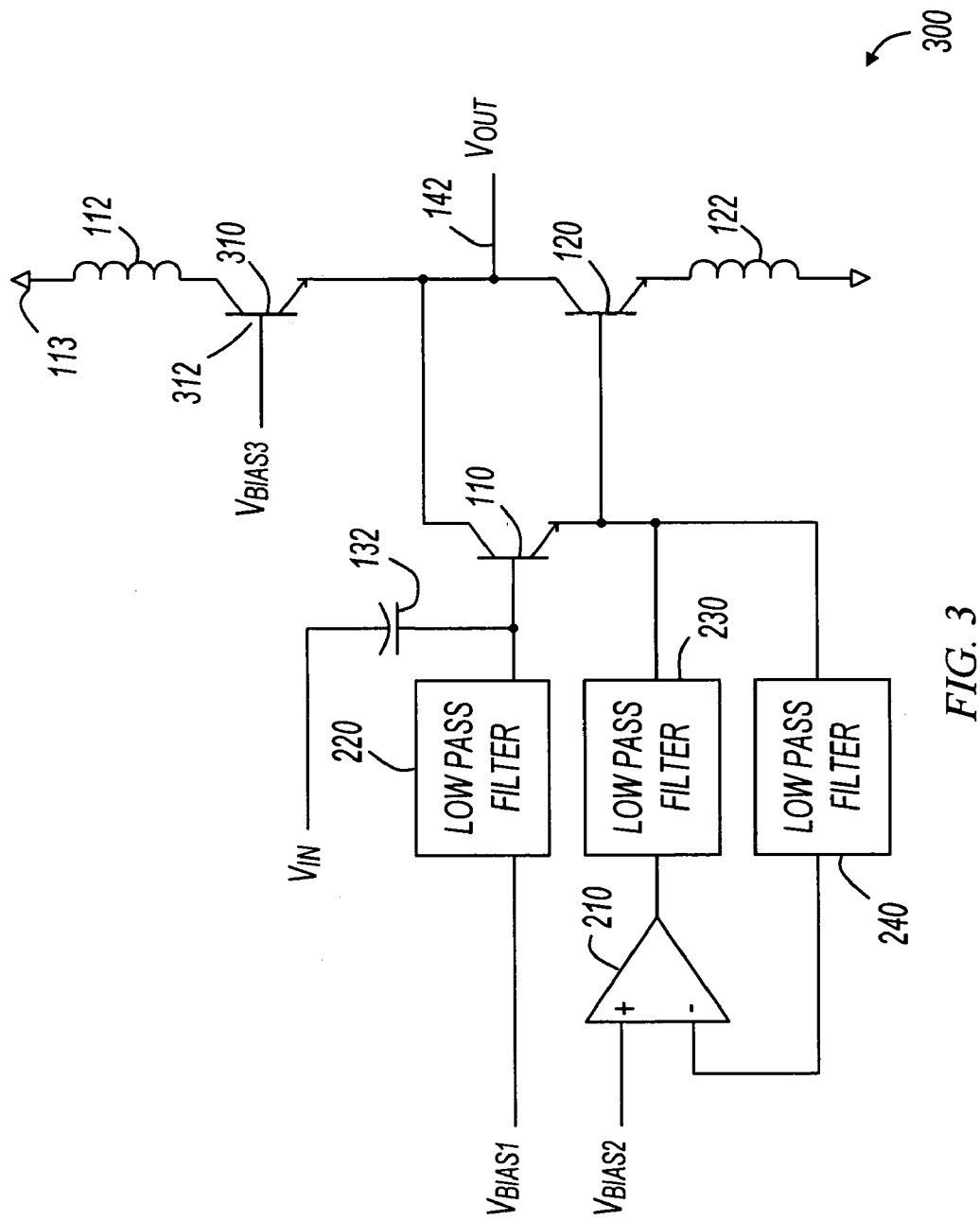

FIG. 3 shows a diagram of a circuit including a Darlington transistor pair in accordance with various embodiments of the present invention. Circuit 300 includes elements similar to those shown in circuit 200 (FIG. 2), with the addition of cascode transistor 310. Cascode transistor 310 is coupled between upper power supply node 113 and the collectors of transistors 110 and 120. In some embodiments, RF choke 112 is coupled between cascode transistor 130 and upper power supply node 113.

Although cascode transistor 310 is shown in FIG. 3 as a bipolar junction transistor, this is not a limitation of the present invention. For example, in some embodiments, cascode transistor 310 is an isolated gate field effect transistor (IGFET), such as a metal oxide semiconductor field effect transistor (MOSFET). As shown in FIG. 3, a bias voltage VBIAS3 is applied to a control terminal 312 of cascode transistor 310. In embodiments that include a BJT cascode transistor 310, control terminal 312 may be referred to as a base terminal, and in embodiments that include an IGFET transistor 310, control terminal 312 may be referred to as a gate terminal.

The addition of cascode transistor 310 to circuit 300 may broaden the operating bandwidth of circuit 300. Further, by modifying the bias voltage VBIAS3 on control terminal 312, the gain of circuit 300 may be modified. In some embodiments, VBIAS3 is modified in response to output signal characteristics detected on output node 142 to implement automatic gain control (AGC). Various embodiments including AGC are described below with reference to later figures.

Figure 4:
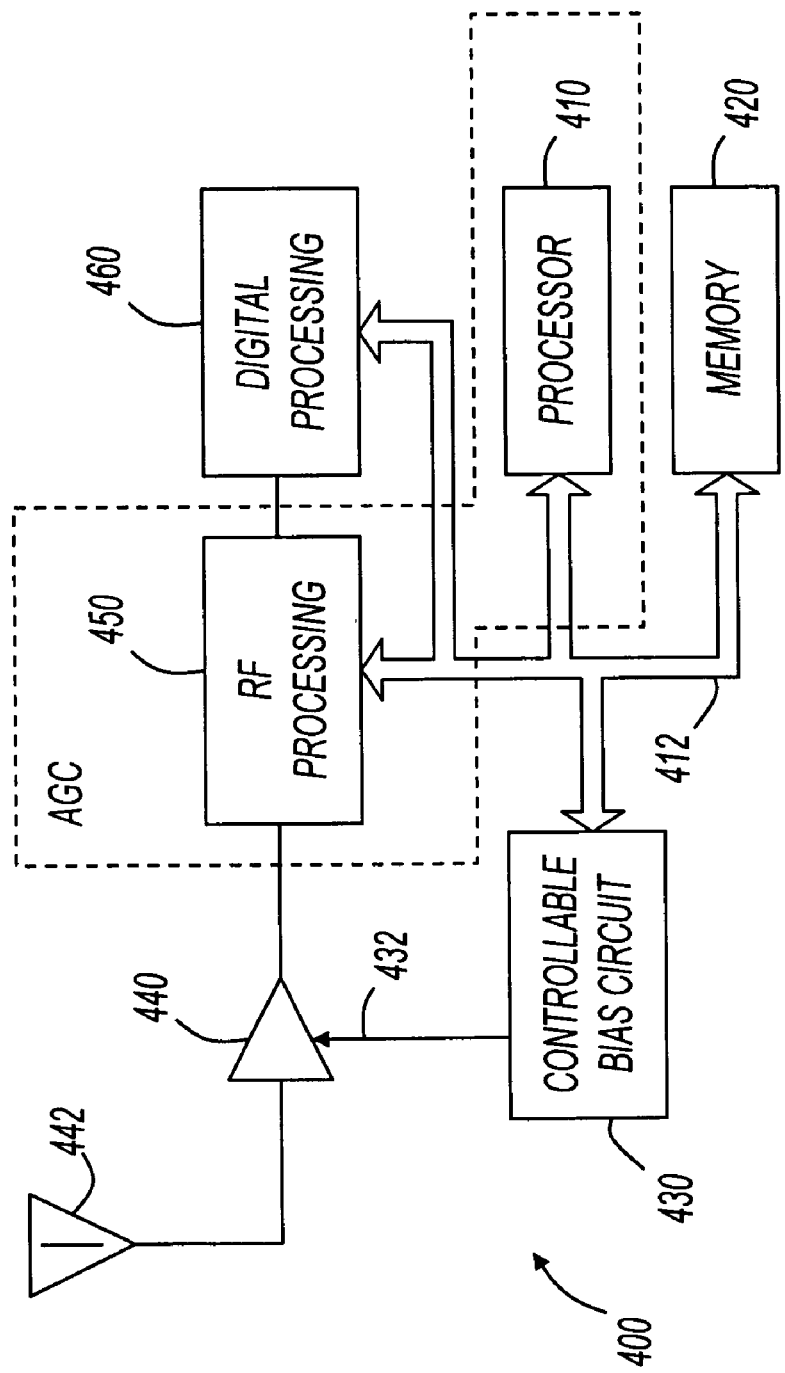

FIG. 4 shows a block diagram of an electronic system. System 400 includes antenna 442, amplifier 440, RF processing block 450, digital processing block 460, processor 410, memory 420, and controllable bias circuit 430. Antenna 442 may be either a directional antenna or an omni-directional antenna. For example, in some embodiments, antenna 442 may be an omni-directional antenna such as a dipole antenna, or a quarter-wave antenna. Also for example, in some embodiments, antenna 442 may be a directional antenna such as a parabolic dish antenna or a Yagi antenna.

Amplifier 440 may be an amplifier that includes a Darlington pair with an increased bias current in an input transistor. For example, amplifier 440 may include any of the embodiments represented by circuit 100 (FIG. 1), circuit 200 (FIG. 2), or circuit 300 (FIG. 3).

In some embodiments, signals transmitted or received by antenna 442 may correspond to voice signals, data signals, or any combination thereof. For example, either or both of RF processing block 450 and digital processing block 460 may include the appropriate circuitry to implement a wireless local area network interface, cellular phone interface, global positioning system (GPS) interface, or the like.

Radio frequency (RF) processing block 450 receives RF signals from antenna 442 and in various embodiments, performs varying amounts and types of signal processing. For example, in some embodiments, RF processing block 450 may include oscillators, mixers, filters, demodulators, detectors, decoders, or the like. Also for example, RF processing block 450 may perform signal processing such as frequency conversion, carrier recovery, symbol demodulation, or any other suitable signal processing.

In some embodiments, RF processing block 450 is controlled by, and provides information to, processor 410. For example, in some embodiments, the type of demodulation may be influenced by commands or control signals provided to RF processing block 450 by processor 410. Further, in some embodiments, RF processing block 450 may provide information such as signal strength or frequency to processor 410. Processor 410 may influence the operation of other blocks shown in FIG. 4 in response to information received from RF processing block 450. For example, an automatic gain control (AGC) loop may be formed by RF processing block 450, processor 410, controllable bias circuit 430, and amplifier 440.

Digital processing block 460 receives a signal from RF processing block 450, and performs various amounts and types of digital processing. For example, digital processing block 460 may perform de-interleaving, decoding, error recovery, or the like. As described above, digital processing block 460 may include the appropriate circuitry to implement any type of communications system, including but not limited to, wireless networking, cellular telephony, and satellite signal reception. The various embodiments of the present invention are not limited by the many possible physical implementations of digital processing block 460.

The various blocks shown in FIG. 4 are coupled by bus 412. Bus 412 may be any type of bus including any number of conductors. For example, bus 412 may be any type of communications interface, including but not limited to, a serial interface, a parallel interface, a processor bus, a system bus, or the like.

In some embodiments, processor 410 may be any suitable processor to influence the operation of other circuits such as controllable bias circuit 430. In some embodiments, processor 410 may perform operations in support of method embodiments of the present invention. For example, processor 410 may perform actions listed in method 600 (FIG. 6), described below. Processor 410 represents any type of processor, including but not limited to, a microprocessor, a microcontroller, a digital signal processor, a personal computer, a workstation, or the like. Further, processor 410 may be formed of dedicated hardware, such as state machines or the like.

Memory 420 represents an article that includes a machine readable medium. For example, memory 420 represents any one or more of the following: a hard disk, a floppy disk, random access memory (RAM), dynamic random access memory (DRAM), static random access memory (SRAM), read only memory (ROM), flash memory, CDROM, or any other type of article that includes a medium readable by a machine such as processor 410. In some embodiments, memory 420 can store instructions for performing the execution of the various method embodiments of the present invention.

In operation of some embodiments, processor 410 reads instructions and data from memory 420 and performs actions in response thereto. For example, various method embodiments of the present invention may be performed by processor 410 while reading instructions from memory 420.

Controllable bias circuit 430 may produce one or more bias voltages and provide them to amplifier 440. For example, controllable bias circuit 430 may produce one or more of VBIAS1, VBIAS2, or VBIAS3 to bias various transistors as shown in FIGS. 1–3. In some embodiments, controllable bias circuit 430 includes a voltage controlled current source such as voltage controlled current source 130 (FIG. 1). In some embodiments, controllable bias circuit 310 includes multiple separately controllable bias circuits to modify the various bias voltages.

Various bias voltages are provided to amplifier 440 on node 432. In some embodiments, node 432 includes multiple physical conductors, each carrying a separate bias voltage. In other embodiments, various bias voltages are multiplexed onto a single conductor of node 432. The number and type of physical conductors represented by node 432 is not a limitation of the present invention.

As shown in FIG. 4, the various blocks of system 400 may be implemented separately. In some embodiments, two or more of the blocks shown are implemented on a single integrated circuit die. For example, processor 410 and memory 420 may be implemented on the same integrated circuit along with digital processing block 460. Also for example, in some embodiments, all of the blocks except for antenna 442 are included on a single integrated circuit. Any combination of circuits on a single integrated circuit die is possible without departing from the scope of the present invention.

Although FIG. 4 shows an amplifier used in conjunction with an antenna, this is not a limitation of the present invention. For example, many electronic systems may employ amplifier 440 without the use of an antenna. For example, in some embodiments, amplifier 440 is included in an optoelectronic system, and employed to amplify electrical signals converted from optical signals. These embodiments do not necessarily utilize an antenna.

Figure 5:
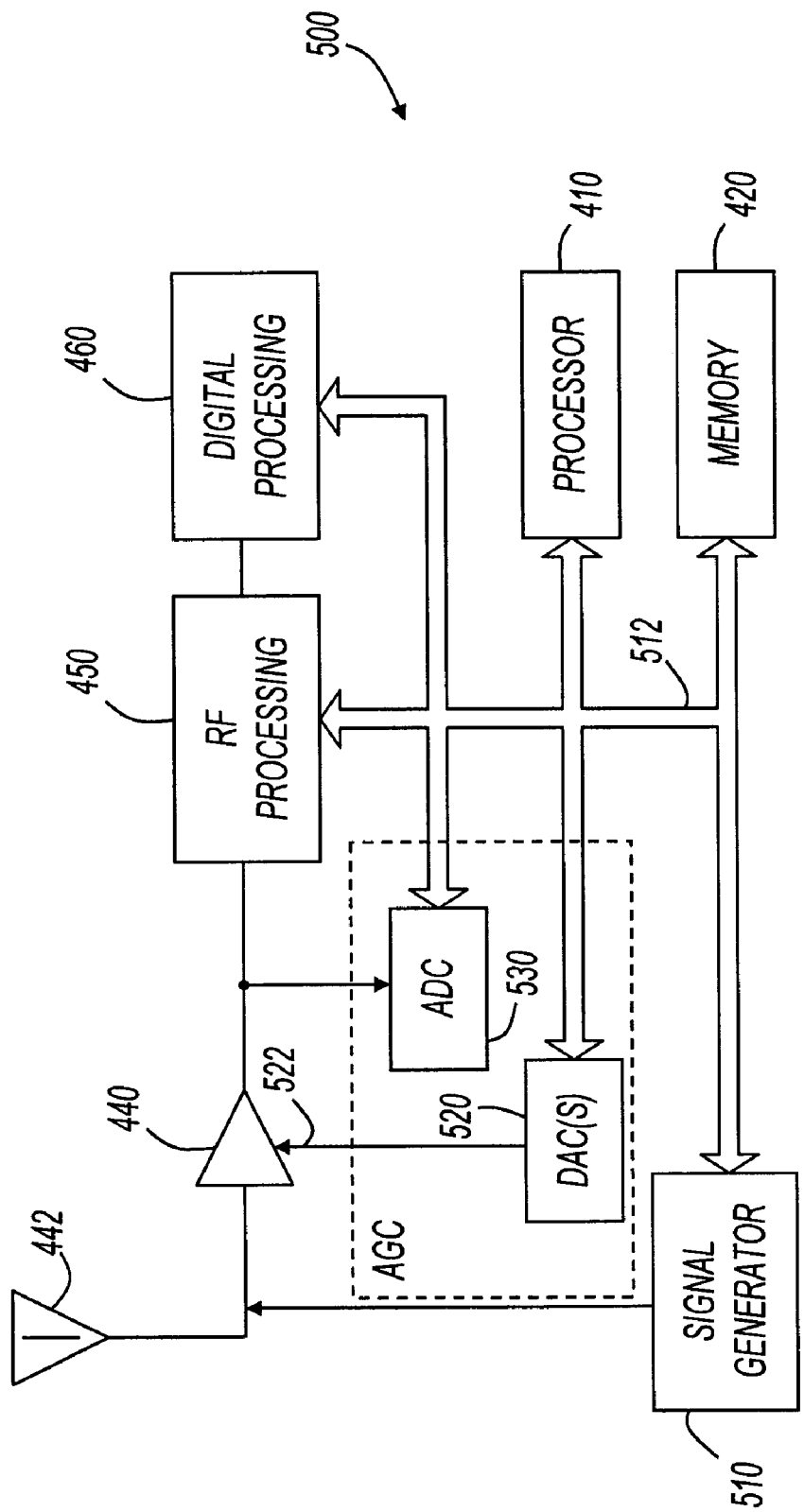

FIG. 5 shows an electronic system in accordance with various embodiments of the present invention. System 500 includes antenna 442, amplifier 440, RF processing block 450, digital processing block 460, processor 410, and memory 420. System 500 also includes signal generator 510, digital-to-analog converter (DAC) 520, and analog-to-digital converter (ADC) 530.

Digital-to-analog converter 520 may produce bias voltages and provide them to amplifier 440 on node 522. In some embodiments, DAC 520 serves as one or more controllable bias circuits, such as controllable bias circuit 430 (FIG. 4). Further, in some embodiments, DAC 520 includes multiple digital-to-analog converters.

Various bias voltages are provided to amplifier 440 on node 522. In some embodiments, node 522 includes multiple physical conductors, each carrying a separate bias voltage. In other embodiments, various bias voltages are multiplexed onto a single conductor of node 522. The number and type of physical conductors represented by node 522 is not a limitation of the present invention.

In some embodiments, signal generator 510 conditionally drives a reference signal at the input of amplifier 440. Also in some embodiments, ADC 530 may measure signal characteristics of signal output from amplifier 440, and provide the signal characteristic information to other blocks in system 500 via bus 512.

System 500 may utilize signal generator 510 to calibrate various portions of the system, including amplifier 440. For example, processor 410 may inject a reference signal into amplifier 440 using signal generator 510, measure signal characteristics using ADC 530, and alter bias voltages by influencing the operation of DAC 520. In these embodiments, bias voltages on an input transistor of a Darlington pair may be modified to change operating frequency characteristics of, or to reduce noise in, amplifier 440. Also in these embodiments, a bias voltage on a cascode transistor may be modified to change the gain of amplifier 440.

An automatic gain control (AGC) control loop may be formed from amplifier 440, ADC 530, and DAC 520. For example, ADC 530 may measure an output signal level, and adjust the output of DAC 520 to influence the gain of amplifier 440.

ADC 530 represents a device capable of measuring signal characteristics of the output signal driven by amplifier 440. In some embodiments, signal characteristics are measured using a device other than an analog-to-digital converter. For example, in some embodiments, a peak detector, an envelope detector, or other signal characteristic measurement device is utilized in place of, or in addition to, ADC 530.

The various blocks shown in FIG. 5 are coupled by bus 512. Bus 512 may be any type of bus including any number of conductors. For example, bus 512 may be any type of communications interface, including but not limited to, a serial interface, a parallel interface, a processor bus, a system bus, or the like.

As shown in FIG. 5, the various blocks of system 500 may be implemented separately. In some embodiments, two or more of the blocks shown are implemented on a single integrated circuit die. For example, processor 410 and memory 420 may be implemented on the same integrated circuit along with digital processing block 460. Also for example, in some embodiments, all of the blocks except for antenna 442 are included on a single integrated circuit. Any combination of circuits on a single integrated circuit die is possible without departing from the scope of the present invention.

Although FIG. 5 shows an amplifier used in conjunction with an antenna, this is not a limitation of the present invention. For example, many electronic systems may employ amplifier 440 without the use of an antenna. For example, in some embodiments, amplifier 440 is included in an optoelectronic system, and employed to amplify electrical signals converted from optical signals. These embodiments to not necessarily utilize an antenna.

Systems, amplifiers, Darlington transistor pairs, controllable bias circuits, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, any of the amplifier embodiments described herein may be represented as polygons assigned to layers of an integrated circuit.

Figure 6:
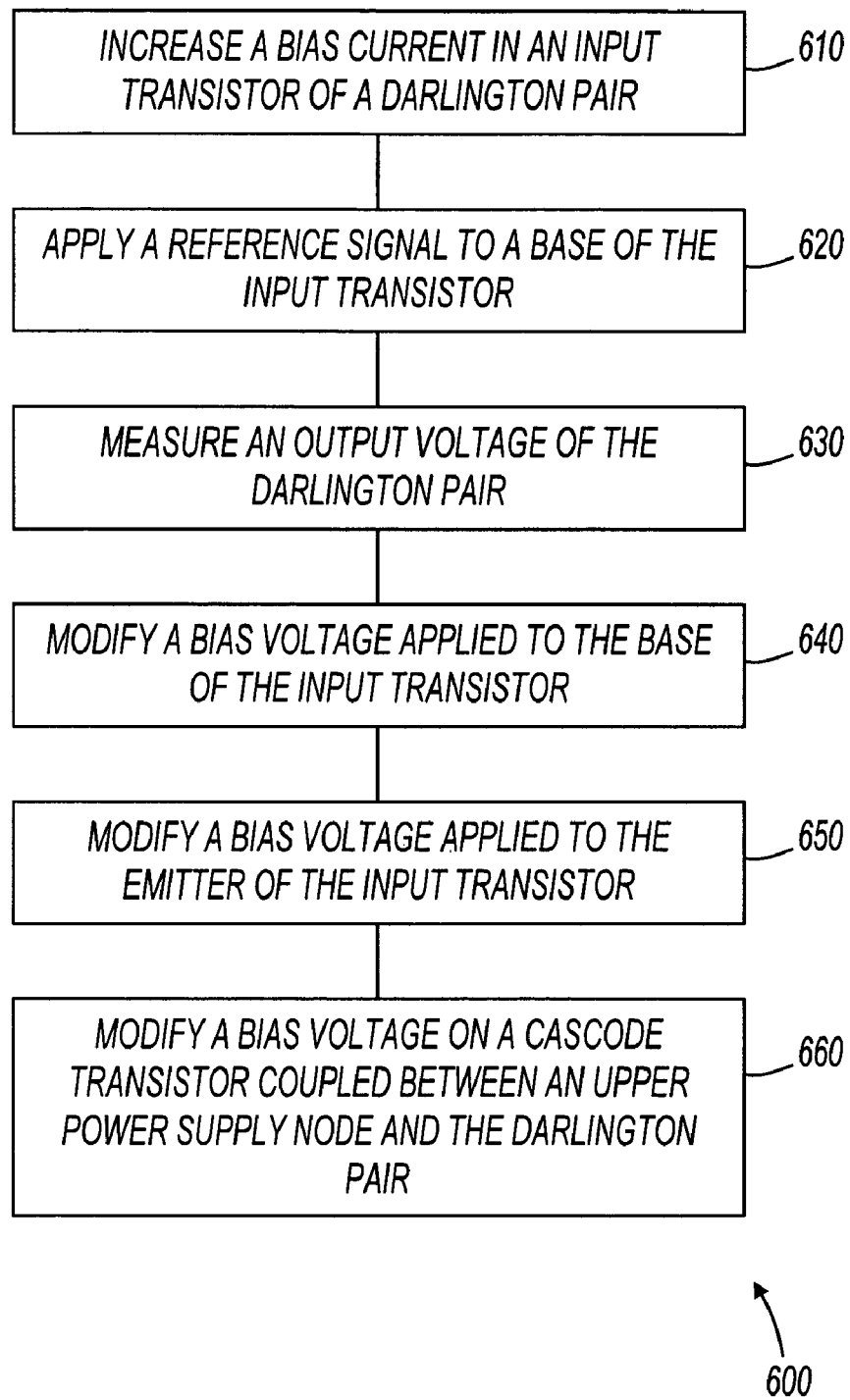

FIG. 6 shows a flowchart in accordance with various embodiments of the present invention. In some embodiments, method 600, or portions thereof, is performed by an electronic system, a processor, or a control loop, embodiments of which are shown in the various figures. In other embodiments, all or a portion of method 600 is performed by a control circuit or processor. Method 600 is not limited by the particular type of apparatus or software element performing the method. The various actions in method 600 may be performed in the order presented, or may be performed in a different order. Further, in some embodiments, some actions listed in FIG. 6 are omitted from method 600.

Method 600 is shown beginning with block 610 where a bias current in an input transistor of a Darlington pair is increased. In some embodiments, this corresponds to increasing a collector-to-emitter bias current in transistor 110 (FIGS. 1, 2, 3). In other embodiments, this corresponds to increasing a base-to-emitter bias current in the same transistor. In still further embodiments, this corresponds to increasing both the collector-to-emitter bias current and the base-to-emitter bias current in transistor 110.

At 620, a reference signal is applied to a base of the input transistor. This may correspond to a signal generator such as signal generator 510 (FIG. 5) driving a signal on the input of amplifier 440 (FIG. 5). At 630, an output voltage of the Darlington pair is measured. The output voltage of the Darlington pair may be measured in many different ways. In some embodiments, the output voltage is measured using an analog-to-digital converter such as ADC 530 (FIG. 5).

At 640, a bias voltage applied to the base of the input transistor is modified, and at 650, a bias voltage applied to the emitter of the input transistor is modified. These bias voltage modifications may serve many different purposes. For example, bias voltage modifications may alter the magnitude of bias currents in the input transistor of the Darlington pair to alter operating characteristics of an amplifier. For example, operating characteristics such as gain-bandwidth product, maximum operating frequency, and noise figure may be modified by changing the values of bias voltages.

At 660, the bias voltage on a cascode transistor coupled between an upper power supply node and the Darlington pair is modified. For example, referring now back to FIG. 3, VBIAS3 may be modified to influence the operation of cascode transistor 310.

In some embodiments, the various bias voltages referred to above may be modified in response to signal characteristics of an output signal measured at 630. Further, the various bias voltages may be modified in response to a relationship between the applied reference signal, and measured output voltage characteristics.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
    an input transistor and a second transistor coupled as a Darlington pair; and
    a bias circuit to increase a collector-to-emitter bias current in the input transistor, wherein the bias circuit comprises an operational amplifier coupled to maintain a substantially constant base voltage on the second transistor.

2. The apparatus of claim 1 further comprising an inductor coupled to a collector of the second transistor.

3. The apparatus of claim 1 further comprising an inductor coupled to an emitter of the second transistor.

4. An apparatus comprising:
    an amplifier including an input transistor and a second transistor coupled as a Darlington pair;
    a controllable bias circuit coupled to an emitter of the input transistor, wherein the controllable bias circuit comprises an operational amplifier coupled to maintain a substantially constant emitter voltage on the input transistor; and
    a control circuit to influence operation of the controllable bias circuit.

5. The apparatus of claim 4 further comprising a second controllable bias circuit coupled to a base of the input transistor.

6. The apparatus of claim 4 further comprising a low pass filter between an output of the operational amplifier and the emitter of the input transistor.

7. The apparatus of claim 4 wherein the control circuit includes a digital-to-analog converter.

8. The apparatus of claim 4 wherein the control circuit includes a processor.

9. An apparatus comprising:
    an amplifier including an input transistor and a second transistor coupled as a Darlington pair;
    a controllable bias circuit coupled to an emitter of the input transistor;
    a control circuit to influence operation of the controllable bias circuit to increase a collector-to-emitter bias current in the input transistor; and
    a cascode transistor coupled between an upper power supply node and a collector of the input transistor.

10. The apparatus of claim 9 further comprising a controllable bias circuit coupled to a control node of the cascode transistor.

11. An apparatus comprising:
    an amplifier including an input transistor and a second transistor coupled as a Darlington pair;
    a controllable bias circuit coupled to an emitter of the input transistor;
    a control circuit to influence operation of the controllable bias circuit to increase a collector-to-emitter bias current in the input transistor;
    a cascode transistor coupled between an upper power supply node and a collector of the input transistor; and
    a controllable bias circuit coupled to a control node of the cascode transistor, wherein the control circuit is coupled to influence operation of the controllable bias circuit for the cascode transistor.

12. The apparatus of claim 11 wherein the input transistor comprises a heterojunction bipolar transistor.

13. The apparatus of claim 11 wherein the input transistor comprises an Indium Phospate transistor.

14. An apparatus comprising:
    an amplifier including an input transistor and a second transistor coupled as a Darlington pair;
    a controllable bias circuit coupled to an emitter of the input transistor;
    a control circuit to influence operation of the controllable bias circuit to increase a collector-to-emitter bias current in the input transistor;
    a cascode transistor coupled between an upper power supply node and a collector of the input transistor;
    a controllable bias circuit coupled to a control node of the cascode transistor, and an automatic gain control circuit coupled between an output of the amplifier and the controllable bias circuit for the cascode transistor.

15. The apparatus of claim 14 wherein the input transistor comprises a heterojunction bipolar transistor.

16. The apparatus of claim 14 wherein the input transistor comprises an Indium Phospate transistor.

17. An electronic system comprising:
an antenna;
an amplifier coupled to the antenna, the amplifier including an input transistor and a second transistor coupled as a Darlington pair;
a controllable bias circuit coupled to an emitter of the input transistor, wherein the controllable bias circuit comprises an operational amplifier coupled to maintain a substantially constant emitter voltage on the input transistor; and
a control circuit to influence operation of the controllable bias circuit.

18. The electronic system of claim 17 further comprising a second controllable bias circuit coupled to a base of the input transistor.

19. The electronic system of claim 17 wherein the control circuit comprises a processor.

20. A method comprising:
increasing a bias current in an input transistor of a Darlington pair by providing a current path from, and a voltage path to, an emitter of the input transistor;
modifying a bias voltage on a cascode transistor coupled between an upper power supply node and the Darlington pair;
applying a reference signal to a base of the input transistor; and
measuring an output voltage of the Darlington pair.

21. The method of claim 20 further comprising modifying a bias voltage applied to the base of the input transistor.

22. The method of claim 20 wherein increasing a bias current comprises changing a bias voltage on a voltage controlled current source.

* * * * *